(12) United States Patent
Nagatomo

(10) Patent No.: US 8,315,112 B2
(45) Date of Patent: Nov. 20, 2012

(54) CURRENT DETECTION CIRCUIT FOR DETECTING READ CURRENT FROM A MEMORY CELL

(75) Inventor: Masahiko Nagatomo, Miyazaki (JP)

(73) Assignee: Lapis Semiconductor Co., Ltd. (JP)

( * ) Notice: Subject to any disclaimer, the term of this patent is extended or adjusted under 35 U.S.C. 154(b) by 45 days.

(21) Appl. No.: 13/024,917

(22) Filed: Feb. 10, 2011

(65) Prior Publication Data

US 2011/0205778 A1 Aug. 25, 2011

(30) Foreign Application Priority Data

Feb. 25, 2010 (JP) ................................. 2010-040933

(51) Int. Cl.
*G11C 5/14* (2006.01)

(52) U.S. Cl. .................................. 365/189.09; 365/207
(58) Field of Classification Search ............. 365/189.09, 365/207, 104
See application file for complete search history.

(56) References Cited

U.S. PATENT DOCUMENTS

| | | | | |
|---|---|---|---|---|
| 5,699,295 A | * | 12/1997 | Yero | 365/185.21 |
| 5,889,702 A | * | 3/1999 | Gaultier et al. | 365/185.2 |
| 5,973,959 A | * | 10/1999 | Gerna et al. | 365/185.03 |
| 2011/0234311 A1 | * | 9/2011 | Hirashiki et al. | 327/581 |

FOREIGN PATENT DOCUMENTS

JP 61-129800 6/1986

* cited by examiner

*Primary Examiner* — Anh Phung

(74) *Attorney, Agent, or Firm* — Studebaker & Brackett PC; Donald R. Studebaker

(57) ABSTRACT

A current detection circuit that can normally perform a current detection operation to detect a current in a memory cell of a memory device even if an applied power supply voltage is a low voltage, includes a current detection means which comprises first and second MOS transistors of a same channel type and third to sixth MOS transistors of a channel type different from the channel type of the first and second MOS transistors, and a MOS gate control means which supplies, to a control electrode of each of the first and second MOS transistors, a voltage which is obtained by subtracting an absolute value of a threshold voltage of each of the first and second MOS transistors from the power supply voltage when the power supply voltage is equal to or lower than the absolute value of the threshold voltage.

12 Claims, 3 Drawing Sheets

Prior Art

US 8,315,112 B2

CURRENT DETECTION CIRCUIT FOR DETECTING READ CURRENT FROM A MEMORY CELL

BACKGROUND OF THE INVENTION

1. Field of the Invention

The present invention relates to a current detection circuit that detects a read current from a memory cell in a memory system such as a ROM (read only memory) or the like.

2. Description of the Related Art

FIG. 1 shows an example of a conventional current detection circuit in a ROM which is disclosed in Japanese Patent Kokai No. S61-129800 (Patent Literature 1) as a read circuit. This conventional current detection circuit includes PMOS transistors (P channel type MOS Field Effect Transistors) 1, 2 of the same shape, NMOS transistors (N channel type MOS Field Effect Transistors) 3, 4 of the same shape, and NMOS transistors 5, 6 of the same shape. As shown in FIG. 1, the PMOS transistor 1 and the NMOS transistors 3 and 5 are series connected by the connection at the drain and the source of each transistor. The source of the PMOS transistor 1 constituting an end of the series circuit is connected to an application terminal of a voltage Vcc and the source of the NMOS transistor 5 constituting the other end of the series circuit is connected to an application terminal of a ground potential Vss=0V. The gates of the PMOS transistor 1 and the NMOS transistors 3 and 5 are commonly connected, and further connected to a node N1 which is a junction point of the drain of the PMOS transistor 1 and the drain of the NMOS transistor 3. Similarly, the PMOS transistor 2 and the NMOS transistors 4 and 6 are series connected at the drain and the source of each transistor. The source of the PMOS transistor 2 constituting an end of the series circuit is connected to the application terminal of the voltage Vcc and the source of the NMOS transistor 6 constituting the other end of the series circuit is connected to the application terminal of a ground potential Vss. The gates of the PMOS transistor 2 and the NMOS transistor 4 are connected to a connection line of the above-described node N1, and the gate of the NMOS transistor 6 is connected to a node N2 which is a junction point of the drain of the PMOS transistor 2 and the drain of the NMOS transistor 4.

A reference current Ir is supplied to a node N3 which is a junction point of the source of the NMOS transistor 3 and the drain of the NMOS transistor 5. Furthermore, one of a plurality of data lines to which a plurality of memory cells (not shown) constituting a memory matrix are connected is selectively connected to a node N4 which is a junction point of the source of the NMOS transistor 4 and the drain of the NMOS transistor 6. On of the plurality of data lines is selected by a data line decoder (not shown), and a detection current I from a memory cell is supplied to the node N4 via the selected one of the data lines. Details of the memory cell, the data line decoder and the word line decoder which will be described later are disclosed in the Patent Literature 1.

The above described node N1 and node N2 are connected to an output terminal via a differential amplifier 9.

In the conventional current detection circuit described above, when reading recorded data of a certain memory cell in the memory matrix in the form of a current, the memory cell is selected by the above-described data line decoder and a word line decoder which is not depicted, and the selected memory cell is connected to the node N4 via the data line. The detection current I flows into the node N4 from the selected memory cell and a reference current Ir for the detection current I flows into the node N3. By these flows of currents, a difference voltage indicating the magnitude relationship between the reference current Ir and the detection current I appears between the node N1 and the node N2, and the difference voltage is amplified by the differential amplifier 9 and outputted as read data of the selected memory cell. In this process, the potential at the node N4 is fixed at a potential determined according to the circuit constants and the amount of the reference current Ir, and a potential variation by the electric charge stored in a stray capacity of the data line caused by the switching of the data line is rapidly compensated, so that speedup of the access time is realized.

SUMMARY OF THE INVENTION

In the conventional current detection circuit described above, it is necessary that the voltage Vcc, i.e., the power supply voltage, is higher than an absolute value of the threshold voltage Vt (hereinafter, referred to as Vtp) of the PMOS transistor 1 in order to turn on the PMOS transistor 1. Similarly, it is necessary that the potential at the node N1 is higher than the absolute value of the threshold voltage Vt (hereinafter, referred to as Vtn) of the NMOS transistor 1 in order to turn on the NMOS transistors 3 and 5. Since the potential at the node N1 does not exceed a potential Vcc−Vtp, it is necessary that the voltage Vcc is equal to or higher then Vtp+Vtn in order that the NMOS transistors 3, 5 turn on to perform normal operation. For instance, when Vtp=0.8V and Vtn=0.8V, the necessary power voltage Vcc is 1.6V, so that the current detection cannot be performed correctly if the power voltage Vcc is lower than 1.6V. However, in the current status in which memories are used extensively, it is desired that the current detection is performed correctly even under a low voltage condition in which the power voltage Vcc is further low.

In view of this, an objective of the present invention is to provide a current detection circuit that can normally perform a current detection operation to detect the current flowing into the memory in the memory device even if the power supply voltage applied to the current detection circuit is a low voltage.

A current detection circuit according the present invention is a current detection circuit for detecting a current flowing into one memory cell selected from a plurality of memory cells in a memory device which is quipped with the plurality of memory cells, including a current detection means which comprises: first and second MOS transistors of a same channel type and third to sixth MOS transistors of a channel type different from the channel type of said first and second MOS transistors, wherein a first electrode of each of said first and second MOS transistors is connected to a high side application terminal of a power supply voltage, a second electrode of said first MOS transistor is connected to a first electrode of said third MOS transistor to form a first node which constitutes a first detection output, a second electrode of said second MOS transistor is connected to a first electrode of said fourth MOS transistor to form a second node which constitutes a second detection output, a second electrode of said third MOS transistor is connected to a first electrode of said fifth MOS transistor to form a third node to which a reference current is supplied, a second electrode of said fourth MOS transistor is connected to a first electrode of said sixth MOS transistor to form a fourth node to which a current is supplied from said one memory cell, a second electrode of each of said fifth and sixth MOS transistors is connected to a low side application terminal of said power supply voltage, and said second node is connected to a control electrode of said sixth MOS transistor; and a MOS gate control means which supplies, to a control electrode of each of said first and second MOS transistors, a voltage which is obtained by subtracting an absolute value of a threshold voltage of each of said first and second MOS transistors from said power supply voltage when said power supply voltage is equal to or lower than the absolute value of said threshold voltage.

In the current detection circuit according to the present invention, a voltage obtained by subtracting the absolute value of the threshold voltage is supplied to the control electrode of each of the first and second MOS transistors when the power supply voltage becomes equal to or higher than the absolute value of the threshold voltage of each of the first and second MOS transistor, so that the third and fifth MOS transistors are on-controlled when the first MOS transistor turns on. Thus, the current detection operation can be normally performed even if the power supply voltage applied on the current detection circuit is a low voltage which is slightly higher than the threshold voltage. Furthermore, the currents flowing in the first and second transistors are not dependent on the power supply voltage, the consumption current can be reduced when the power supply voltage is a high voltage.

DETAILED DESCRIPTION OF THE INVENTION

An embodiment of the present invention will be described in detail with reference to accompanying drawings.

Figure 2:
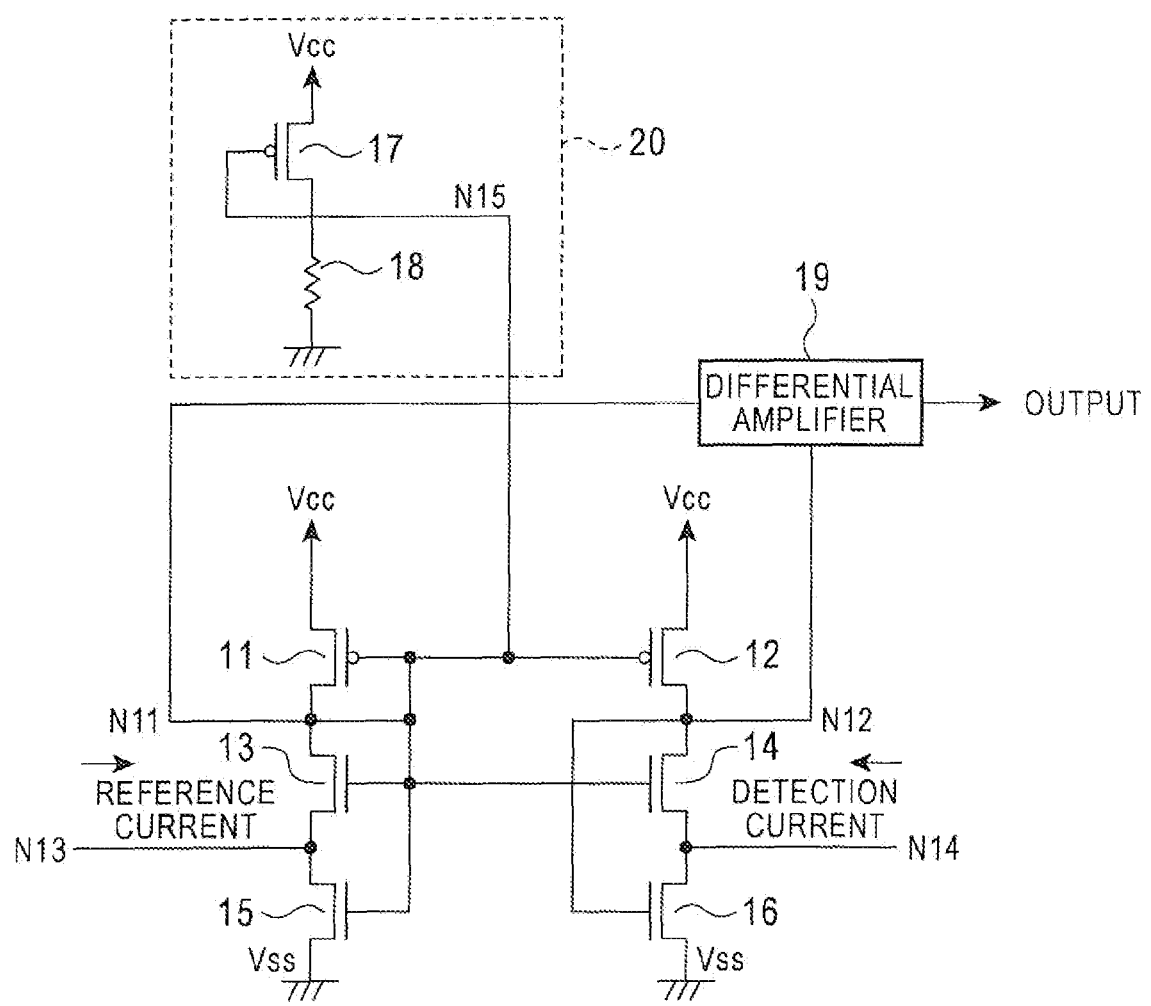
FIG. 2 is a circuit diagram showing an embodiment of the current detection circuit of the present invention.

FIG. 2 shows a structural example of a current detection circuit according to the present invention. The current detection circuit includes PMOS transistors 11 and 12 of the same shape (first and second MOS transistors), NMOS transistors 13 and 14 of the same shape (third and fourth MOS transistors), and NMOS transistors 15 and 16 of the same shape (fifth and sixth MOS transistors) and additionally includes a PMOS gate control circuit 20. Preferably, together with a PMOS transistor 17 described later, the PMOS transistors 11 and 12 are P channel type MOS FETs having same characteristics, and the NMOS transistors 13 to 16 are N-channel type MOS FETs having same characteristics. The transistors 11 to 16 constitute current detection means, and the PMOS gate control circuit 20 constitutes MOS gate control means.

As shown in FIG. 2, the PMOS transistor 11 and the NMOS transistors 13 and 15 are series-connected at the source and the drain of each of the transistors. The source of the PMOS transistor 11 that constitutes one end of the series circuit is connected to a high voltage side application terminal of a voltage VCC (power supply voltage), and the source of the NMOS transistor 15 that constitutes the other end of the series circuit is connected to a low voltage side application terminal of the ground potential Vss=0V. The gates of the NMOS transistors 13 and 15 are commonly connected, and further connected to a node N11 (first node) that is a junction point of the drain of the PMOS transistor 11 and the drain of the NMOS transistor 13. Similarly, the PMOS transistor 12 and the NMOS transistors 14 and 16 are series-connected at the source and the drain of each of the transistors. The source of the PMOS transistor 12 that constitutes one end of the series circuit is connected to the application terminal of a voltage VCC, and the source of the NMOS transistor 16 that constitutes the other end of the series circuit is connected to the application terminal of the ground potential Vss. The gate of the PMOS transistor 12 and the gate of the PMOS transistor 11 are commonly connected, and further connected to a PMOS gate control circuit 20. The gate of the NMOS transistor 14 is connected to a line connected to the node N11. The gate of the NMOS transistor 16 is connected to a node N12 (second node) that is a junction point of the drain of the PMOS transistor 12 and the drain of the NMOS transistor 14.

A reference current Ir is supplied to a node N13 (third node) that is a junction point of the source of the NMOS transistor 13 and the drain of the NMOS transistor 15. Furthermore, one of a plurality of data lines to which a plurality of memory cells (not depicted) is selectively connected to a Node (fourth node) N14 that is a junction point of the source of the NMOS transistor 14 and the drain of the NMOS transistor 16. The selection of one data line from the plurality of data lines is performed by a data line decoder (not depicted) which selects one data line, and a detection current I from the memory cell is supplied to the node N14 via the selected one data line.

The node N11 and the node N12 are connected to an output terminal via a differential amplifier 19.

The PMOS gate control circuit 20 is made up of a PMOS transistor 17 (seventh MOS transistor) and a resistor 18. The source of the PMOS transistor 17 is connected to the application terminal of the voltage VCC, and the drain of the PMOS transistor 17 is connected to one end of the resistor 18 together with the gate of the PMOS transistor 17. The one end of the resistor 18 is a node N15. The other end of the resistor 18 is connected to the application terminal of the ground potential Vss. The gate of each of the PMOS transistors 11 and 12 is connected to the node N15. The resistance value of the resistor 18 is set at a value sufficiently high with respect to the on-resistance of the PMOS transistor 17.

In the current detection circuit according to the present invention having the structure described above, since the resistance of the resistor is set to be sufficiently high, the level at the node N15 becomes Vcc−Vtp when the power supply voltage Vcc becomes equal to or higher than the threshold voltage Vtp.

The PMOS transistor 11 turns on in response to the level at the node N15, and a level equal to or above Vtn, past the level Vcc−Vtp, is outputted at the node N11. As a result, the NMOS transistors 3 and 5 turn on. As an example, the current detection circuit according to the present invention can operate correctly when Vcc is equal to or higher than 0.8V under a condition that Vtp=0.8V, Vtn=0.8V.

Additionally, the gate-source voltage Vgs of each of the PMOS transistors 11 and 12 stays at −Vtp scarcely dependent on the rise of Vcc, so that the currents flowing through the PMOS transistors 11 and 12 become almost independent of the voltage Vcc.

Figure 1:
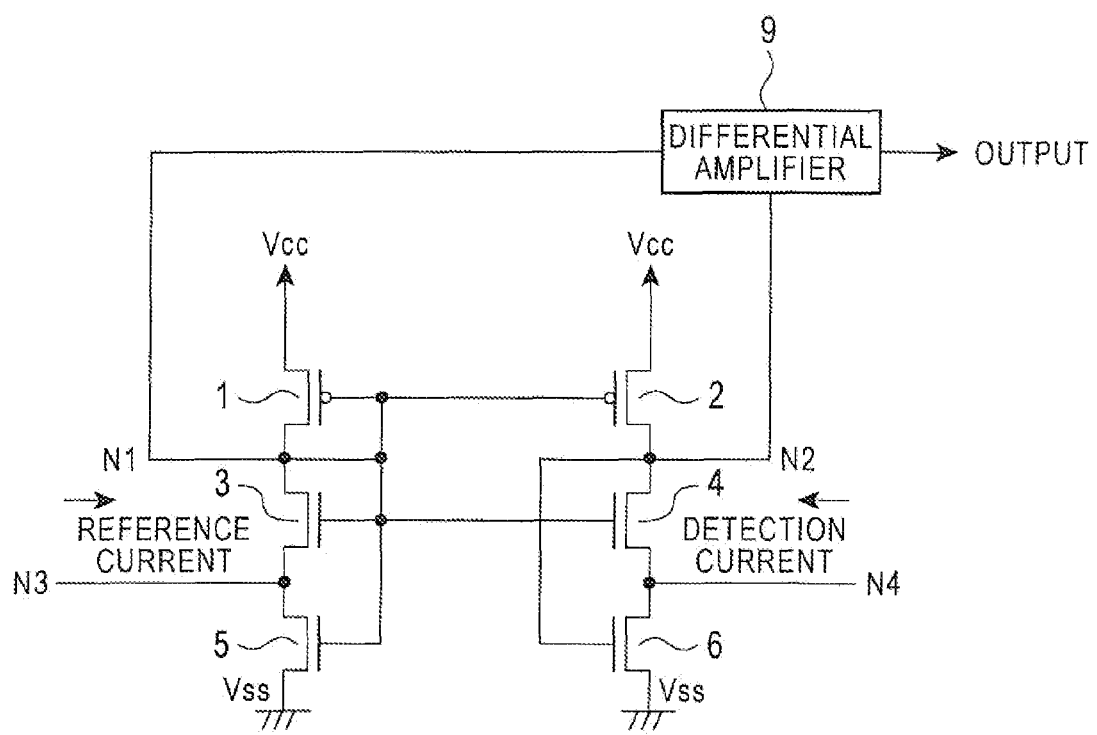
FIG. 1 is a circuit diagram showing an example of the structure of a conventional current detection circuit.
Figure 3A:
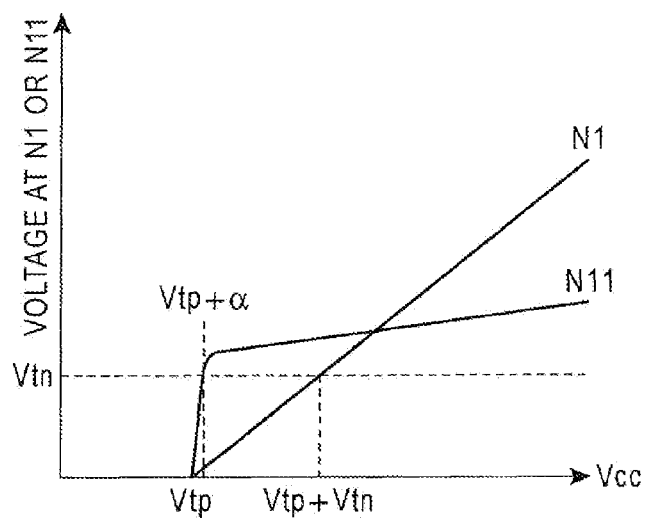
FIGS. 3A and 3B are explanatory diagrams showing the operation of the current detection circuit shown in FIG. 2 relatively to the operation of the conventional current detection circuit.
Figure 3B:
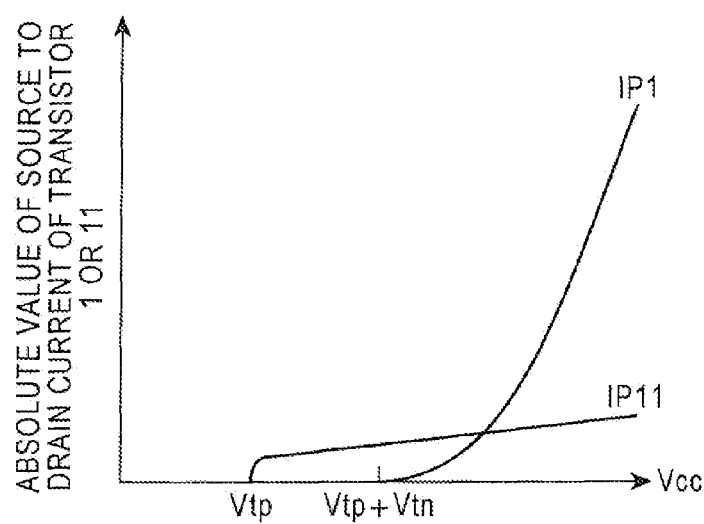

FIGS. 3A and 3B show waveforms, dependent on the power supply voltage Vcc, of the current detection circuit of the embodiment and of the conventional current detection circuit shown in FIG. 1. In FIG. 3A, the lines labeled N1 and N11 indicate the voltages at the node N1 and N11 respectively. In FIG. 3B, the lines labeled by IP1 and IP11 respectively indicate absolute values of the source-drain currents of the PMOS transistors 1 and 11. According to FIG. 3A, it can be recognized that, in the conventional current detection circuit, the power supply voltage Vcc is at Vtp+Vtn (Vcc=Vtp+Vtn) when the potential at the node N1 is equal to the threshold voltage Vtn. In the current detection circuit of the embodiment, the power supply voltage Vcc is at Vtp+α (Vcc=Vtp+α) when the potential at the node N1 is equal to the threshold voltage Vtn where α is smaller than Vtn (Vtn>α).

According to FIG. 3B. it can be recognized that, in the conventional current detection circuit, the current IP1 starts to flow when the power supply voltage Vcc is at Vtp+Vtn (Vcc=Vtp+Vtn). In the current detection circuit of the embodiment, the current IP11 starts to flow when the power supply voltage Vcc is at Vtp (Vcc=Vtp) which is lower than the voltage of Vtp+Vtn in the conventional current detection circuit by Vtn, so that the potential at the node N11 is established by the current IP11.

Consequently, in the current detection circuit of the embodiment, the PMOS transistor 11 and the NMOS transistors 13 and 15 are turned on to start the normal operation of the current detection circuit when the power supply voltage Vcc at around the Vtp or Vtn. Thus, the minimum operation voltage, that is, the voltage Vcc can be set at a lower voltage than the conventional current detection circuit.

Since the source-drain currents of the PMOS transistors 11 and 12 are scarcely dependent on the voltage Vcc, current consumption of the current detection circuit can be reduced when the circuit is operating at high operation voltage.

An example of low voltage operating condition is that the working voltage is in a range of 2.0V to 3.6V and the internal voltage is in a range of 1.8V to 2.0V where the internal voltage corresponds to the power supply voltage Vcc. As another example, the current detection circuit according to the present invention can be used under a condition that the working voltage is in a range of 2.7V to 5.5V and the internal voltage is in a range of 2.3V to 2.5V. The working voltage and the internal voltage are not limited to the examples mentioned above.

Additionally, the structure of the PMOS gate control circuit 20 is not limited to that of the embodiment described above. As an example, it is possible to construct the PMOS gate control circuit using a differential amplifier and a reference voltage generation circuit. It is only necessary that the PMOS gate control circuit supplies a voltage Vcc−Vtp to the gate of each of the PMOS transistors 11 and 12 when the voltage Vcc becomes equal to or higher than Vtp.

Furthermore, it is needless to mention that the low side power supply voltage Vss may be a potential other than the ground potential 0V.

The device to which the present invention is applicable is not limited to ROMs, and the present invention is applicable to memory devices that are configured to output the current flowing in a memory cell.

This application is based on Japanese Patent Application No. 2010-040933 which is herein incorporated by reference.

What is claimed is:

1. A current detection circuit for detecting a current flowing into one memory cell selected from a plurality of memory cells in a memory device which is quipped with the plurality of memory cells, including a current detection part which comprises:
   first and second MOS transistors of a same channel type and third to sixth MOS transistors of a channel type different from the channel type of said first and second MOS transistors,
   wherein a first electrode of each of said first and second MOS transistors is connected to a high side application terminal of a power supply voltage, a second electrode of said first MOS transistor is connected to a first electrode of said third MOS transistor to form a first node which constitutes a first detection output,
   a second electrode of said second MOS transistor is connected to a first electrode of said fourth MOS transistor to form a second node which constitutes a second detection output,
   a second electrode of said third MOS transistor is connected to a first electrode of said fifth MOS transistor to form a third node to which a reference current is supplied,
   a second electrode of said fourth MOS transistor is connected to a first electrode of said sixth MOS transistor to form a fourth node to which a current is supplied from said one memory cell,
   a second electrode of each of said fifth and sixth MOS transistors is connected to a low side application terminal of said power supply voltage, and
   said second node is connected to a control electrode of said sixth MOS transistor; and
   a MOS gate control part which supplies, to a control electrode of each of said first and second MOS transistors, a voltage which is obtained by subtracting an absolute value of a threshold voltage of each of said first and second MOS transistors from said power supply voltage when said power supply voltage is equal to or lower than the absolute value of said threshold voltage.

2. The current detection circuit according to claim 1, wherein said MOS gate control part comprises a seventh MOS transistor of a channel type the same as a channel type of said first and second MOS transistor, a first electrode of said seventh MOS transistor is connected to the high voltage side application terminal of said power supply voltage, and a second electrode of said seventh MOS transistor is connected to a control electrode of said seventh MOS transistor, thereby forming a fifth node, and further connected to said low voltage side application terminal of said power supply voltage via said resistor, and said fifth node is connected to the control terminal of each of said first and second MOS transistor.

3. The current detection circuit according to claim 2, wherein a resistance value of resistor is sufficiently higher than an on-resistance of said seventh MOS transistor.

4. The current detection circuit according to claim 2, wherein said first, second and seventh MOS transistors are P-channel MOS field effect transistors, and first and second electrodes and a control electrode of each of said first, second and seventh MOS transistors are a source, a drain, and a gate in that order and wherein first and second electrodes and a control electrode of each of said third to sixth MOS transistors are a a drain, a source and a gate in that order.

5. The current detection circuit according to claim 1, further comprising a differential amplifier to which the voltage at said first node and the voltage at said second node are supplied.

6. The current detection circuit according to claim 1, wherein said circuit operates under a condition that a working voltage is in a range of 2.0V to 3.6V and said power supply voltage as an internal voltage is in a range of 1.8V to 2.0V.

7. A current detection circuit for detecting a current flowing into one memory cell selected from a plurality of memory cells in a memory device which is quipped with the plurality of memory cells, including a current detection means which comprises:
   first and second MOS transistors of a same channel type and third to sixth MOS transistors of a channel type different from the channel type of said first and second MOS transistors,
   wherein a first electrode of each of said first and second MOS transistors is connected to a high side application terminal of a power supply voltage, a second electrode of said first MOS transistor is connected to a first electrode of said third MOS transistor to form a first node which constitutes a first detection output, a second electrode of said second MOS transistor is connected to a first electrode of said fourth MOS transistor to form a second node which constitutes a second detection output, a second electrode of said third MOS transistor is connected to a first electrode of said fifth MOS transistor to form a third node to which a reference current is supplied, a second electrode of said fourth MOS transistor is connected to a first electrode of said sixth MOS transistor to form a fourth node to which a current is supplied from said one memory cell, a second electrode of each of said fifth and sixth MOS transistors is connected to a low side application terminal of said power supply voltage, and said second node is connected to a control electrode of said sixth MOS transistor; and a MOS gate control means which supplies, to a control electrode of each of said first and second MOS transistors, a voltage which is obtained by subtracting an absolute value of a threshold voltage of each of said first and second MOS transistors from said power supply voltage when said power supply voltage is equal to or lower than the absolute value of said threshold voltage.

8. The current detection circuit according to claim 7, wherein said MOS gate control means comprises a seventh MOS transistor of a channel type the same as a channel type of said first and second MOS transistor, a first electrode of said seventh MOS transistor is connected to the high voltage side application terminal of said power supply voltage, and a second electrode of said seventh MOS transistor is connected to a control electrode of said seventh MOS transistor, thereby forming a fifth node, and further connected to said low voltage side application terminal of said power supply voltage via said resistor, and said fifth node is connected to the control terminal of each of said first and second MOS transistor.

9. The current detection circuit according to claim 8, wherein a resistance value of resistor is sufficiently higher than an on-resistance of said seventh MOS transistor.

10. The current detection circuit according to claim 8, wherein said first, second and seventh MOS transistors are P-channel MOS field effect transistors, and first and second electrodes and a control electrode of each of said first, second and seventh MOS transistors are a source, a drain, and a gate in that order and wherein first and second electrodes and a control electrode of each of said third to sixth MOS transistors are a a drain, a source and a gate in that order.

11. The current detection circuit according to claim 7, further comprising a differential amplifier to which the voltage at said first node and the voltage at said second node are supplied.

12. The current detection circuit according to claim 7, wherein said circuit operates under a condition that a working voltage is in a range of 2.0V to 3.6V and said power supply voltage as an internal voltage is in a range of 1.8V to 2.0V.

* * * * *